United States Patent [19]
Taddiken

[11] Patent Number: 5,789,940
[45] Date of Patent: Aug. 4, 1998

[54] REDUCED COMPLEXITY MULTIPLE RESONANT TUNNELING CIRCUITS FOR POSITIVE DIGIT MULTIVALUED LOGIC OPERATIONS

[75] Inventor: Albert H. Taddiken, McKinney, Tex.

[73] Assignee: Texas Instruments Incorporated, Dallas, Tex.

[21] Appl. No.: 834,785

[22] Filed: Apr. 3, 1997

Related U.S. Application Data

[62] Division of Ser. No. 424,038, Apr. 18, 1995.

[51] Int. Cl.$^6$ .................... H03K 19/00; H03K 19/10
[52] U.S. Cl. .................... 326/60; 326/135; 326/134; 341/133; 341/102; 341/82; 341/83
[58] Field of Search ............... 326/60, 134, 135; 341/133, 102, 82, 83

[56] References Cited

U.S. PATENT DOCUMENTS

| | | | |
|---|---|---|---|
| 3,156,816 | 11/1964 | Kosonocky et al. | 326/135 |
| 3,207,913 | 9/1965 | Herzog | 326/132 |
| 4,465,944 | 8/1984 | Shin | 326/60 |

FOREIGN PATENT DOCUMENTS

| | | |
|---|---|---|
| 435121 | 2/1992 | Japan . |
| 4179313 | 6/1992 | Japan . |

*Primary Examiner*—Stephone Allen
*Assistant Examiner*—Richard Roseen
*Attorney, Agent, or Firm*—W. Daniel Swayze, Jr.; W. James Brady, III; Richard L. Donaldson

[57] ABSTRACT

Multiple resonant tunneling devices offer significant advantages for realizing ultra-dense, ultra-high performance multivalued logic arithmetic integrated circuits. A multivalued logic adder is disclosed, wherein two numbers represented by positive digit base-M range-N words are added by two-input summation circuits 40 which sum corresponding digits, then the digit sums are decomposed into a binary representation by range-7 multivalued to binary converter circuits 42, then three-input summation circuits 44 sum appropriate bits of the binary representations to calculate the digits of a positive digit base-2 range-4 word whose value is the sum of the two numbers. Preferably, the decomposition to binary representation is performed by multi-valued folding circuits 56 which are connected by voltage divider circuitry. Preferably, the multi-valued folding circuits contain multiple-peak resonant tunneling transistors 54. Ripple carries are eliminated and the speed of the adder is independent of input word width.

4 Claims, 7 Drawing Sheets

1

REDUCED COMPLEXITY MULTIPLE RESONANT TUNNELING CIRCUITS FOR POSITIVE DIGIT MULTIVALUED LOGIC OPERATIONS

CROSS-REFERENCE TO RELATED APPLICATIONS

This is a division of application Ser. No. 08/424,038, filed Apr. 18, 1995.

| Title | Ser. No. | Inventor(s) | Docket # |
|---|---|---|---|
| High Frequency High Resolution Quantizer | 07/952,394 | Taddiken | 17052 |
| Multiple Resonant Tunneling Circuits for Positive Digit Range-4 Base-2 to Binary Conversion | 08/065,964 | Taddiken | 17812 |
| Multiple Resonant Tunneling Circuits for Signed Digit Multivalued Logic Operations | 08/066,362 | Taddiken, Micheel | 17813 |
| Multiple Resonant Tunneling Circuits for Positive Digit Multivalued Logic Operations | 08/066,455 | Taddiken | 17811 |

FIELD OF THE INVENTION

This invention generally relates to integrated circuit devices and more particularly to multivalued logic circuits comprising resonant tunneling devices.

BACKGROUND OF THE INVENTION

Without limiting the scope of the invention, its background is described in connection with resonant tunneling devices and multivalued logic.

Resonant Tunneling Devices

Within the last decade, heteroepitaxial technology has allowed researchers to explore the electrical properties of a variety of superlattice, quantum well, and resonant tunneling structures. The first proposals and investigations of the resonant tunneling diode (hereinafter referred to as a RTD) were reported by Chang, Esaki, and Tsu (*Applied Physics Letters*, 24, p. 593) and subsequently given impetus by Sollner et al. (*Applied Physics Letters*, 43, p.588) who observed large negative differential resistance (hereinafter referred to as NDR) in these structures. Because only discrete energy states are available for charge transport through quantum wells of the resonant tunneling diode, the current-voltage relationship of a resonant tunneling diode may exhibit a peak, i.e., for applied voltages increasing from zero, the diode current increases, then decreases for a range of larger applied voltages. Multiple peak resonant tunneling devices (hereinafter referred to as M-RTD) consisting of series combinations of RTDs in epitaxial stacks have also been demonstrated. Fifteen resonant peaks were achieved in a single heterostructure at room temperature recently fabricated at Texas Instruments.

Since the initial investigations of the RTD, many three-terminal resonant tunneling devices have been proposed and demonstrated (see, for example, F. Capasso, S. Sen and F. Beltram, *High Speed Semiconductor Devices* (S. M. Sze, ed.), p. 465, John Wiley & Sons, New York). Integration of RTDs into one or another of the terminals of conventional transistors has led to a large family of resonant tunneling transistors. Among the most promising of these transistors are: the resonant tunneling bipolar transistor (RTBT) (see, for example, F. Capasso, S. Sen, and A. Y. Cho, *Applied Physics Letters*, 51, p. 526); the resonant tunneling hot electron transistor (RHET) (see, for example, N. Yokoyama et al., *Solid State Electronics*, 31, p. 577); and the resonant tunneling field effect transistor (RTFET). These devices are fabricated by placing RTDs in the emitter terminals of heterojunction bipolar transistors, hot electron transistors or field effect transistors, respectively. All of the above-mentioned references have been incorporated by reference in their entirety.

Nanoelectronic devices, such as resonant tunneling diodes and transistors, are under investigation in many laboratories for their potential to operate at dimensions much smaller than conventional transistors can function. The goal of these device designs is to harness the quantum effects themselves to allow scaling to dimensions on a nanometer scale. Examples of such nanoelectronic devices are described, for example, in:

U.S. Pat. No. 4,581,621, "Quantum Device Output Switch", issued Apr. 8, 1986, to Reed;

U.S. Pat. No. 4,704,622, "Negative Transconductance Device", issued Nov. 3, 1987, to Capasso et al.;

U.S. Pat. No. 4,721,983, "Three Terminal Tunneling Device", issued Jan. 26, 1988, to Frazier;

U.S. Pat. No. 4,849,799, "Resonant Tunneling Transistor", issued Jul. 18, 1989, to Capasso et al.;

U.S. Pat. No. 4,851,886, "Binary Superlattice Tunneling Device and Method", issued Jul. 25, 1989, to Lee et al.;

U.S. Pat. No. 4,853,753, "Resonant-Tunneling Device, and Mode of Device Operation", issued Aug. 1, 1989, to Capasso et al.;

U.S. Pat. No. 4,912,531, "Three-Terminal Quantum Device", issued Mar. 27, 1990, to Reed et al.;

U.S. Pat. No. 4,959,696, "Three Terminal Tunneling Device and Method", issued Sep. 25, 1990, to Frensley et al.; and U.S. Pat. No. 4,999,697, "Sequential-Quenching Resonant-Tunneling Transistor", issued Mar. 12, 1991, to Capasso et al.

Multivalued Logic

Binary arithmetic integrated circuits (ICs) have enabled a revolution in the performance of embedded coprocessors and high-performance computers, but scaling limits will ultimately prevent further increases in the speed and density of conventional ICs. Soon after the year 2000, quantum mechanical effects will set fundamental limits on the scalability of conventional transistors (see, for example, R. T. Bate, *Nanotechnology*, 1, p. 1, 1990). Feature sizes less than approximately 0.1 μm will cause leakage in conventional devices that will prevent scaling from increasing IC performance.

In the future, ultra-high performance digital systems will require clock rates in excess of 10 GHz with minimum data latency. Current systems, using binary computation based on silicon VLSI technology, can achieve reasonably good performance by using complex carry-ripple reduction schemes; however, data latency and ultra-fast computing requirements will make this approach unsuitable for certain classes of systems.

Multivalued Logic (hereinafter referred to as MVL) circuits have the potential for increased speed and density (for the same minimum feature geometry) since multiple binary bits may be simultaneously processed in a single MVL circuit. For examples of multivalued logic adders and multipliers which offer ripple-carry free operation through the use of redundant number systems, see, for example: L. J. Micheel, *Proceedings of the International Symposium on MVL*, 1992; J. Goto et al., *International Solid State Circuits Conference*, 1991; and S. Kawahito, K. Mizuno, and T. Nakamura, *Proceedings of the International Symposium on MVL*, 1991.

Previous implementations of multivalued logic has been coupled with the use of isolation circuits. These circuits have resulted in high power requirements and additional complexity.

SUMMARY OF THE INVENTION

The present invention provides an efficient, dense, simple and fast means of implementing multivalued logic operations which is highly desired. Additionally, a low power and less complex circuit to implement the multivalued logic, is achieved and is desirable.

It has been discovered that the multiple resonant tunneling devices offer significant advantages for realizing ultra-dense, ultra-high performance multivalued logic arithmetic integrated circuits. Resonant tunneling devices have novel characteristics that will enable ultra-high speed and ultra-high density circuits even before the quantum scaling limits are reached. Multivalued logic circuits implemented with resonant tunneling devices will achieve increased speed and density over binary circuits and multiple-valued circuits implemented in conventional IC technologies since multiple binary bits are very efficiently processed by architectures which make use of devices exhibiting multiple negative transconductance regions. Furthermore, with the use of CMOS devices in conjunction with the multivalued logic circuits, direct coupling without isolating circuits can be achieved. Input and output summations can be performed by current summing using a simplified circuit topology.

Generally, and in one form of the invention, two numbers represented by positive digit base-M range-N words are input by directly wiring without intervening circuit elements which sum corresponding digits, then the digit sums are decomposed into a binary representation by range-7 multivalued to binary converter circuits, the outputs of the binary converter circuits may be directly wired without intervening circuit elements to form the digits of a positive digit range-4 base-2 word whose value is the sum of the two input numbers. Preferably, the decomposition to binary representation is performed by multi-valued folding circuits which are connected by voltage divider circuitry. Preferably, the multi-valued folding circuits contain multiple-peak resonant tunneling transistors.

This is apparently the first circuit for adding base-M range-N words which incorporates one or more negative differential resistance devices.

The adder of the present invention provides several technical advantages over prior art adders. For example, the adders described herein are faster and denser than conventional adders. Ripple carries are eliminated by the preferred embodiments described herein. The speed of the circuit is independent of input word width. Other technical advantages will be readily apparent to one skilled in the art from the following descriptions, figures and claims.

BRIEF DESCRIPTION OF THE DRAWINGS

The features believed characteristic of the invention are set forth in the appended claims. The invention itself, however, as well as other features and advantages thereof, will be best understood by reference to the detailed description which follows, read in conjunction with the accompanying drawings.

In the drawings.

Corresponding numerals and symbols in the different figures refer to corresponding parts unless otherwise indicated.

DETAILED DESCRIPTION OF THE PREFERRED EMBODIMENTS

Figure 1:
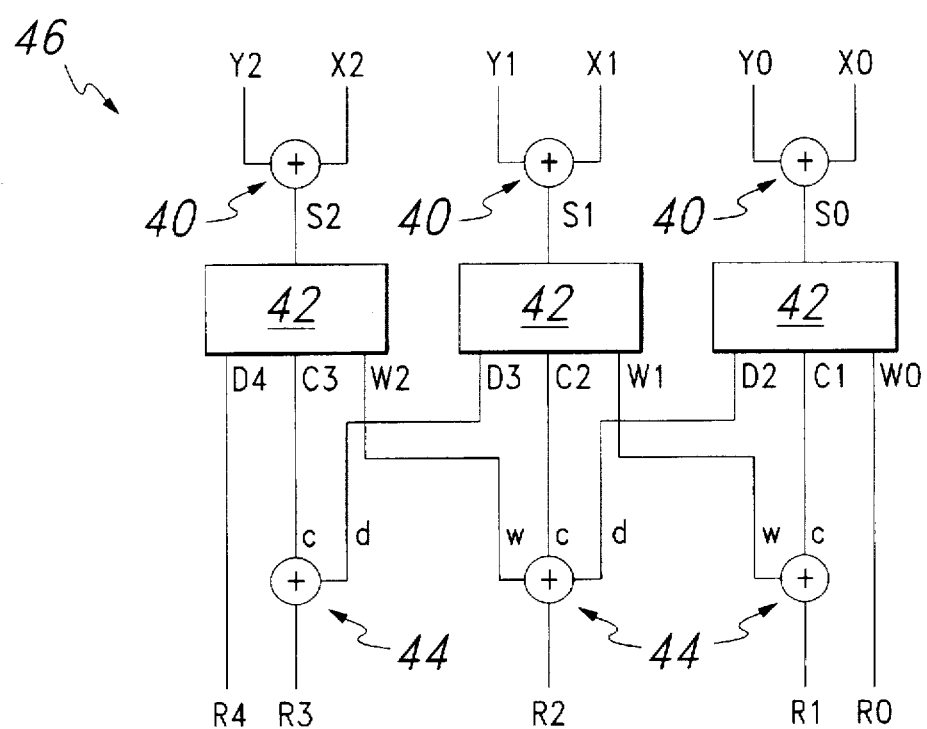
FIG. 1 is the block diagram of a embodiment of a redundant positive digit base-2 range-4 adder.

The advantages of multivalued logic arithmetic are illustrated in the following example. In most conventional digital processors, numbers are represented in a base-2 range-2 numeration system. That is, the unit value of each digit increases in base-2 progression (1, 2, 4, 8, etc.), and each digit may take on one of only two values (0 or 1). Conventional digital processor architectures can add pairs of N-bit numbers in a single processor cycle. However, time delays occur during binary addition because carry bits must propagate through the adder circuitry. Carry propagation delays set an upper limit on processor performance. For example, adding the following numbers in base-2 range-2 representation using simple binary arithmetic requires the long-distance propagation of a carry bit across the entire addition chain:

$$01111 = 15 \text{ (base 10)}$$

$$+ 00001 = 1 \text{ (base 10)}$$

$$10000 = 1^* (16) + 0^* (8) + 0^* (4) + 0^* (2) +$$

```
              0* (1) = 16 (base 10)

◄---- carry
```

The carry propagation problem can be eliminated if data operands are encoded and processed using a multivalued representation. This approach employs a higher range to represent information so that ripple carries are never produced, and carry propagation delays are eliminated. The numbers from the previous example can be added without the need for carry prorogation when represented in base-2 range-3, where each column of bits is separately added using numerical rather than binary addition. The range-3 representation of the result makes carry ripple unnecessary:

```
   01111 = 15 (base 10)
 + 00001 =  1 (base 10)
   ─────
   01112 = 0* (16) + 1* (8) + 1* (4) + 1* (2) +
                                        2* (1) = 16 (base 10)
```

It is important to note that, even though the range of the result is higher, the base of the number system used to represent the result has not changed. That is, the unit value of each digit position still increases in the base-2 progression of 1, 2, 4, 8, and so on. The use of range-N numeration to encode information in base-M progression is called redundant digit M,N coding. If the digits may take on only positive values, then the numeration system is called a redundant positive digit M,N coding. The numeration system of the example above is therefore redundant positive digit 2,3 coding. A numeration system which allows positive and negative digit values is called a redundant signed digit M,N coding.

Scaling and speed advantages of the redundant digit arithmetic concept described above can be realized very efficiently by circuits which make use of the negative differential resistance exhibited by resonant tunneling devices.

The block diagram of a embodiment of an adder of numbers represented by a redundant positive digit 2,4 coding scheme is shown in FIG. 1. Digits may take on the values 0, 1, 2, and 3 (positive digit range-4). The progression of the numeration system is base-2. The circuit illustrated in the block diagram of FIG. 1 inputs words of up to three digits in word width, although the technique may obviously be extended to arbitrary word widths. Positive redundant digit 2,4 coding is used to represent base-2 information in a redundantly encoded (range-4) representation so that ripple carries are never produced. As a consequence, any output digit, e.g. $R_2$, is determined by the first six input digits of equal or lower significance to the output digit, e.g. $X_2$, $Y_2$, $X_1$, $Y_1$, $X_0$ and $Y_0$. Addition is performed in three steps:

Step 1: $S_i = X_i + Y_i$

Step 2: $4D_{i+2} + 2C_{i+1} + W_i = S_i$

Step 3: $R_i = W_i + C_i + D_i$ where the base-10 value of the result is given by $$\sum_{i=0}^{n-1} 2^i R_i$$

where n is the number of digits in the output word.

With reference to FIG. 1, Pairs of input digits ($X_i$, $Y_i$) are first summed by directly connecting without an isolation circuit at terminal 40 circuit to produce outputs digit sums $S_i = X_i + Y_i$ (Step 1, above). Each digit sum is then converted into a 3-bit binary code using a range-7 multivalued-to-binary converter (hereinafter referred to as R7MBC) 42. The R7MBC 42 performs the decomposition function of Step 2, above. Finally, the binary outputs from the adjoining R7MBCs 42 are shared and summed by directly connecting without an isolation circuit at terminal 44 to produce a range-4 output result (Step 3, above). The adder circuit in FIG. 2 can be extended to compute the sum of two numbers of arbitrary word width. The speed of the circuit is independent of the number of input digits because only local intermediate results are shared within the circuit.

For the adder architecture shown in FIG. 1, and generally for an adder of arbitrary input word width, two of the three-input terminals 44 will have only two inputs. The terminal 44 which produces $R_1$ does not have a 'd' input to the terminal. While not shown in FIG. 1, that input without the 'd' input is assumed to have a voltage applied which corresponds to state "0", i.e. the voltage which represents a zero value digit. Similarly, the three input terminal 44 which produces the output digit $R_3$ in FIG. 1 has no 'w' input. Again, while not shown in FIG. 1, that input without the 'w' input is assumed to have a voltage applied which corresponds to state "0", i.e. the voltage which represents a zero value digit.

In the following discussion of the operation of the circuit embodiments, the inputs and outputs will be referred to as states rather than voltages. In a particular circuit design, for example, each state may differ from the next state by 0.3 volts. In one of the embodiments of the adder, circuit voltages are generally proportional to the states they represent. It is contemplated that in some alternate embodiments the relationship between voltage and state need not be strictly linear nor strictly proportional.

Figure 2:
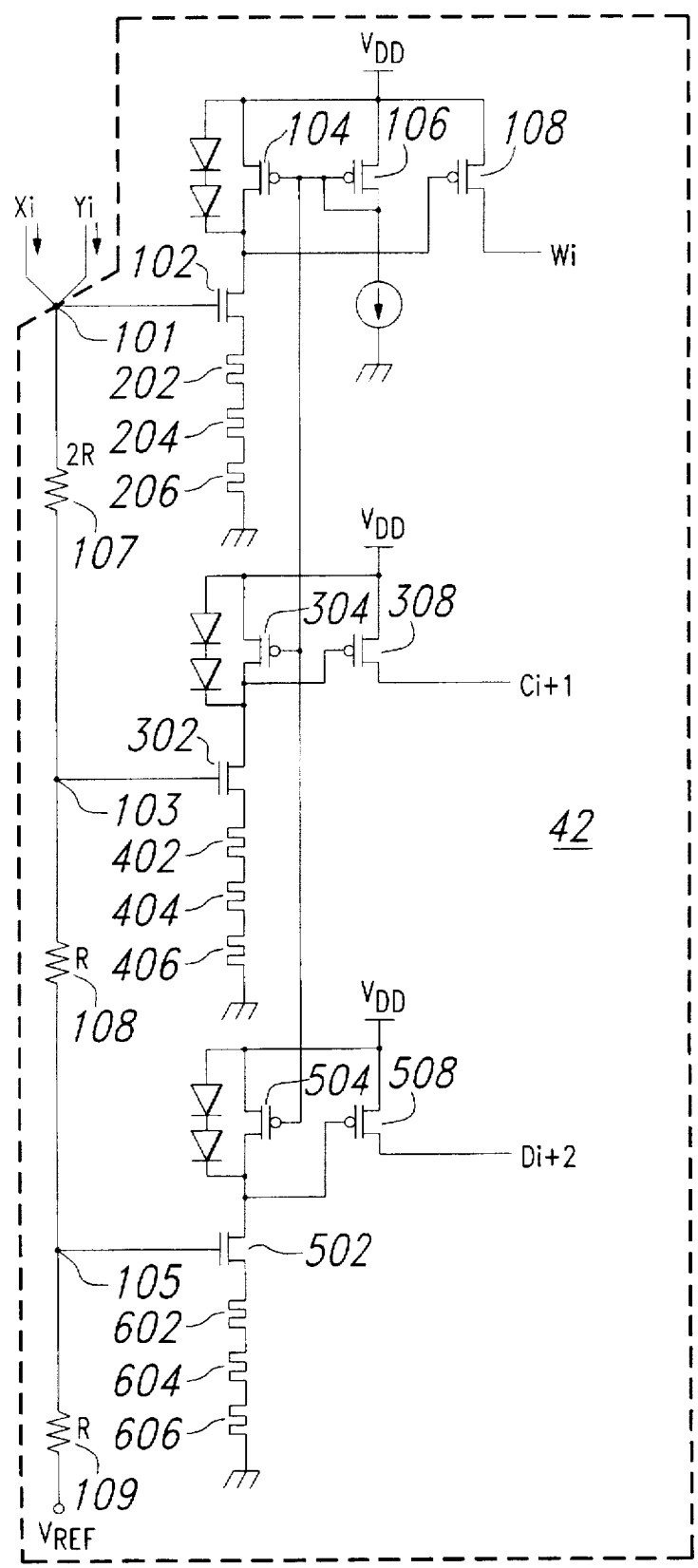
FIG. 2 is a schematic of a embodiment of a range-7 multivalued-to-binary converter circuit.
Figure 3:
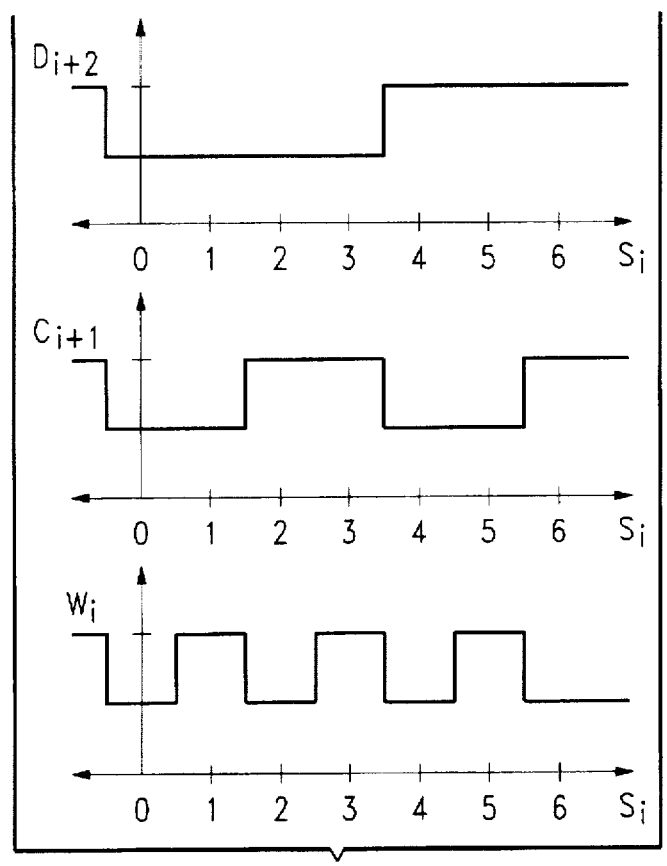
FIG. 3 is graph of the transfer function of the embodiment of the range-7 multivalued-to-binary converter circuit.

The circuit schematic of one of the embodiments of the R7MBC 42 is shown in FIG. 2. The corresponding transfer function is shown in FIG. 3. This is essentially an analog-to-digital conversion of the range-7 sum $S_i$ and would require a considerable number of conventional transistors to implement. As shown in FIG. 3, The R7MBC 42 quantizes the input states "0" through "6" into a binary output code. The circuit of FIG. 2 performs this transfer function, as described and explained below.

Figure 4:
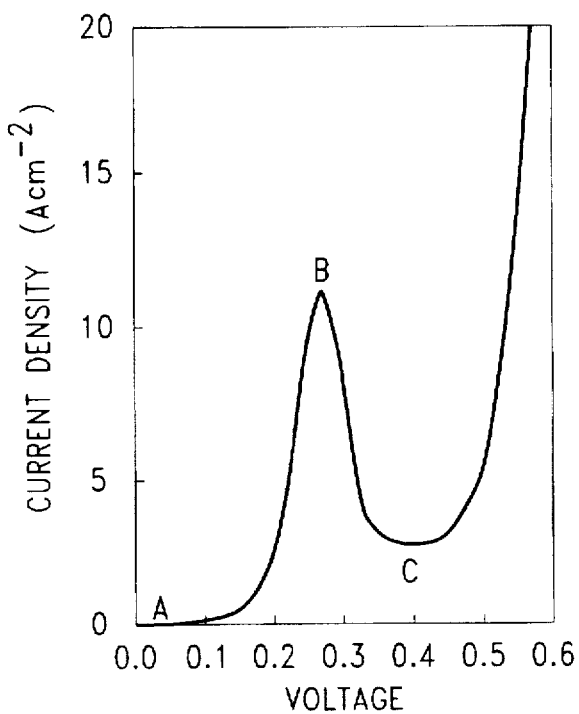
FIG. 4 is a graph of the current-voltage characteristic of a typical resonant tunneling diode.
Figure 5A:
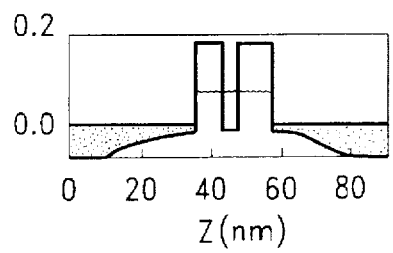
FIGS. 5a–5c are conduction band energy diagrams of a typical resonant tunneling diode with increasing applied voltages.
Figure 5B:
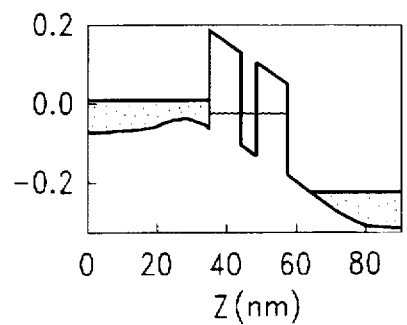
Figure 5C:
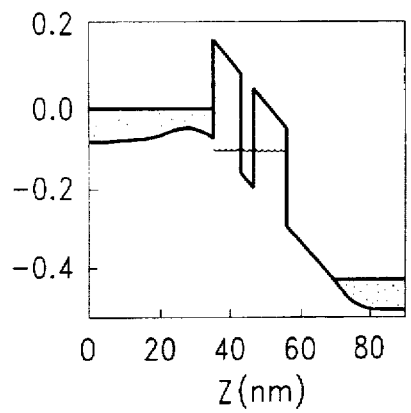
Figure 6:
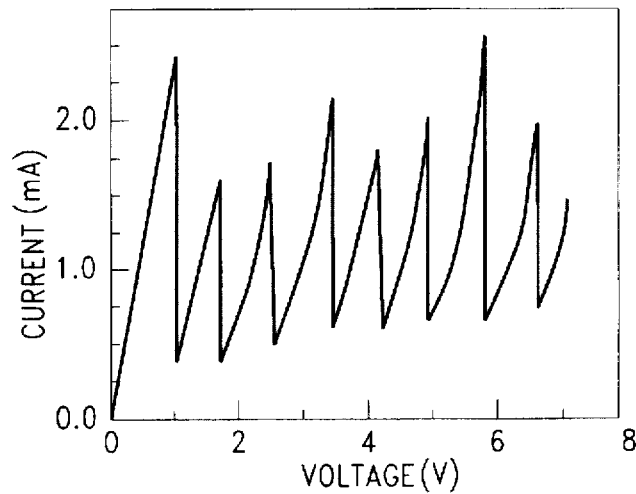
FIG. 6 is a graph of the current-voltage characteristic of an eight-peak resonant tunneling diode.
Figure 7:
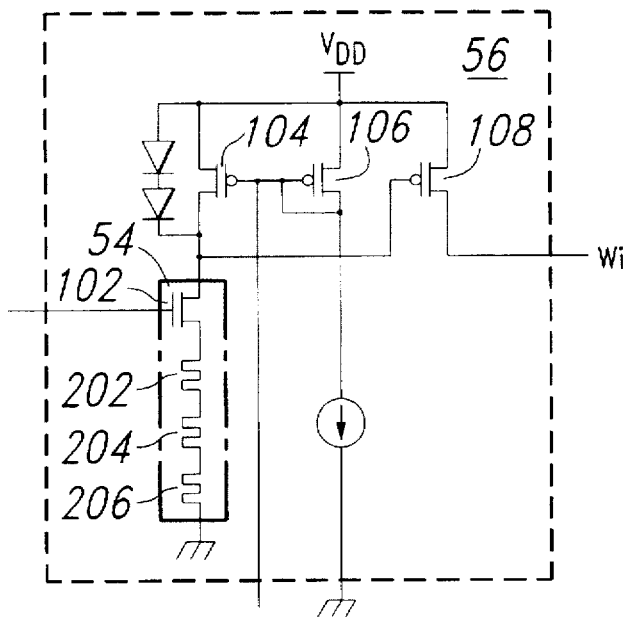
FIG. 7 is a schematic of a folding circuit which forms one output of the range-7 multivalued-to-binary converter.

A resonant tunneling device (RTD) is a device which exhibits negative differential resistance due to resonant tunneling of charge carriers through one or more quantum wells of the RTD. As shown in FIG. 4 and FIGS. 5a–5c, a peak in the I-V curve of an RTD occurs when the applied bias aligns a quantum conduction state within the device with the Fermi level in one electrical contact. FIGS. 5a, 5b and 5c show the conduction band energy diagrams of the RTD under the applied voltages at points A, B and C in FIG. 4, respectively. The position of the I-V peak in bias voltage is adjustable or movable by controlling the heterostructure composition and layer thicknesses used to fabricate the device. RTDs can be integrated in series to produce a multiple peak RTD (M-RTD) with I-V characteristics such as the example I-V characteristic shown in FIG. 6. In this example, the eight-peak I-V characteristic was obtained by fabricating a stack of RTDs within the same heterostructure. Again, both the number and bias separation of peaks are controlled parameters in the fabrication process.

The inputs signal $X_i$ and $Y_i$ as illustrated in FIG. 2 are connected to terminal 101 which is connected to resistor 107 and the gate of N-type transistor 102. The source of transistor 102 is connected to three tunneling diodes 202, 204 and 206 connected in series. The tunneling diode 206 is connected to ground. The drain of transistor 102 is connected to the drain of P type transistor 104 and connected to two series connected diodes which are in turn connected to voltage VDD and the source of transistor 104. The gate of transistor 104 is connected to the gate and drain of P type transistor 106 while the source of transistor 106 is connected to voltage VDD. The gates of transistors 104 and 106 are connected to a constant current device to form a current mirror. The drain of transistor 104 is connected to gate of P-type transistor 108 while the source of transistor 108 is connected to voltage VDD while the drain of transistor 108 outputs signal $W_i$. The drain of transistor 106 is connected to the current source which is in turn connected to ground. The gate of transistor 104 is connected to the gate of P type transistor 304 and the gate of P type transistor 504. The resistor 107 is connected to terminal 103 which in turn is connected to the gate of N type transistor 302. The drain of transistor 302 is connected to the drain of P-type transistor 304 while the source of transistor 304 is connected to two series connected diodes which in turn is connected to the drain of transistor 304. The drain of transistor 304 is connected to the gate of P type transistor 308, which has the source of transistor 308 connected to voltage VDD. Additionally, the drain of transistor 308 outputs signal $C_i+1$. Terminal 103 is connected to resistor 108 which in turn is connected to terminal 105 which is connected to N-type transistor 502. The source of transistor 302 is connected to a series of tunneling diodes 402, 404 and 406. The tunneling diode 406 is connected to ground. The gate of transistor 304 is connected to the gate of P-type transistor 504. The source of transistor 504 is connected to two series connected diodes which in turn is connected to the drain of transistor 504. The source of transistor 504 is connected to voltage VDD. The source of transistor 508 is connected to voltage VDD and the drain of transistor 508 outputs signal $D_{i+2}$. The terminal 105 is connected to resistor 109 which is connected to voltage VREF.

As the state of $X_i$ or $Y_i$ is initially low, transistor 102 is turned off. The current source generates a current that flows through 106 which in turn causes the same current to attempt to flow through the source and drain of transistor 104. Therefore, the drain of transistor 104 is at $V_{dd}$, and transistor 108 is turned off so that no current conducts between its source and drain. As the input voltage $X_i$ or $Y_i$ is applied to the gate of transistor 102, the transistor 102 is switched to a conduction state. As transistor 102 turns on to a conduction state, this current flows through the tunneling diodes 202, 204 and 206. The current increases until the current reaches a predetermined value (resonant peak) beyond which the tunneling diode enters the negative differential resistance region. Turning to FIG. 4, as the voltage increases, the current through the tunneling diode rises. If the peak current is larger than the mirrored current through 104, the drain of 104 is pulled to a lower voltage and turns on 108. After the resonant peak is reached at point B the current decreases as the voltage across the tunneling diode increases. This decrease causes the transistor 102 to enter the nonconducting state eliminating the current flow between source and drain of transistor 102 resulting in the drain voltage of transistor 102 approximately equalling voltage $V_{dd}$. This voltage shuts off transistor 108.

Figure 8A:
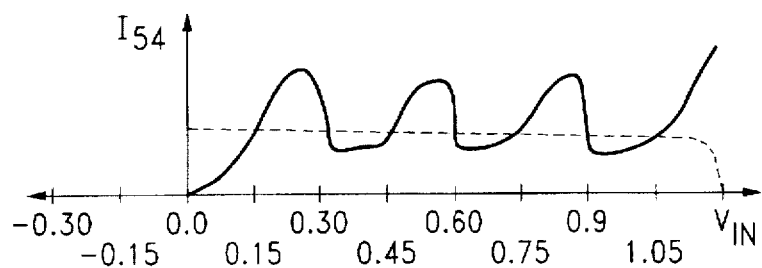
FIG. 8a is a graph showing the intersections of the current-voltage characteristic of the multiple-peak resonant tunneling transistor with the load line of the active load of FIG. 7.
Figure 8B:
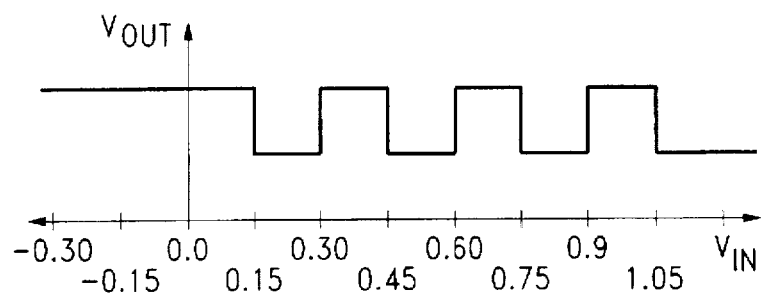
FIG. 8b is a graph of the transfer function of the folding circuit of FIG. 7.

The three-peak M-RTD characteristic shown in FIG. 8a can be obtained either by a series combination of three RTDs (in a stack or by metal interconnection of single RTDs) or by use of a single coupled quantum well heterostructure. When RTDs are combined in series, the off-resonance RTDs in the chain may introduce an undesirable internal series resistance, $R_S$. This series resistance $R_S$ can cause a voltage hysteresis equal in magnitude to the product of the difference between the peak and valley currents and the difference between the negative differential resistance and the positive series resistance $R_S$. The onset of this hysteresis effect occurs when the accumulated series resistance exceeds the RTD negative differential resistance. The total number of RTDs that can be combined in series, therefore, is generally limited by the accumulated series resistance of the specific device implementation.

The electrical properties of a resonant tunneling device are determined, in part, by the thicknesses, materials, and doping of its constituent layers. An example of a resonant tunneling diode structure which exhibits a three-peak characteristic is given in Table 1. The structure is a stack of epitaxially formed layers, layer 1 formed on the substrate, layer 2 formed on layer 1, etc.

TABLE 1

| Layer Number | Material | Thickness | Description |
|---|---|---|---|
| 1 | InGaAs | 0.5 μm | Cathode contact layer |
| 2, 10, 18 | InGaAs | 500 Å | Ohmic layer |
| 3, 11, 19 | InGaAs | 20 Å | Spacer layer |
| 4, 12, 20 | AlAs | 20 Å | Barrier layer |
| 5, 13, 21 | InGaAs | 10 Å | Quantum Well |
| 6, 14, 22 | InAs | 20 Å | Notch in Quantum Well |
| 7, 15, 23 | InGaAs | 10 Å | Quantum Well |
| 8, 16, 24 | AlAs | 20 Å | Barrier Layer |
| 9, 17, 25 | InGaAs | 20 Å | Spacer Layer |
| 26 | InGaAs | 500 Å | Ohmic Layer |
| 27 | InGaAs | 2500 Å | Anode Contact Layer |

Figure 9:
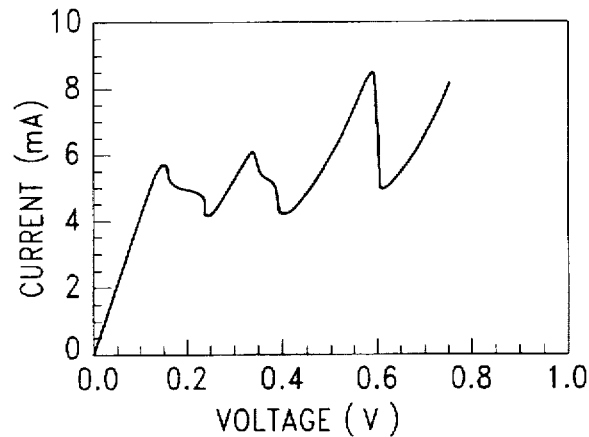
FIG. 9 is a graph of the current-voltage characteristic of a three-peak resonant tunneling diode.

The structure give by Table 1 exhibits the current-voltage characteristic shown in FIG. 9. Two traces are present in this figure, although only a single trace is apparent. One trace shows the characteristic for a positive voltage ramp beginning at zero bias, and a second trace begins at 0.8 V and decreases to 0 V. The difference between these curves is less than the 3 mV resolution of the measurement equipment.

To achieve sufficient noise margins in MVL circuitry, the three-peak M-RTDs should generally have relatively equal peak and valley currents, relatively equally spaced peak voltages, modest peak-to-valley ratio, and low hysteresis. Table 2 shows examples of values for some M-RTD parameters.

TABLE 2

| M-RTD Parameter | Preferred Values |
|---|---|
| Peak current variation | ≦10% |
| Valley current variation | ≦20% |
| Peak voltage spacing deviation from linearity | ≦5% |
| Peak-to-valley ratio (PVR) | ≧4 |
| Hysteresis | ≦10 mV |

Similarly, preferred values can be given for the FET switching transistor parameters. Table 3 shows preferred values for some FET parameters.

TABLE 3

| FET Parameter | Preferred Values |
|---|---|
| Hysteresis | ≦20 mV |
| Gate-drain breakdown voltage | 4 V |

TABLE 3-continued

| FET Parameter | Preferred Values |
|---|---|
| Nominal $V_T$ | $-0.3$ V |
| $V_T$ local matching | $\leq 20$ mV |

Another Embodiment

Figure 10:
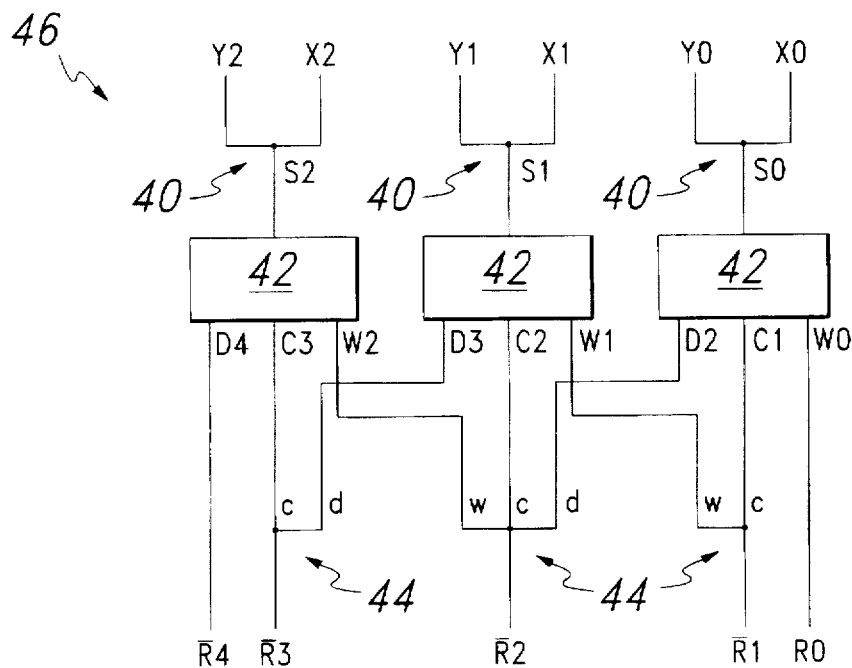
FIG. 10 is the block diagram of another embodiment of a redundant positive digit range-4 base-2 adder.

The block diagram of second preferred embodiment for an adder of numbers represented by redundant positive digit 2,4 coding is shown in FIG. 10. As in the previously described embodiment, digits may take on the values 0, 1, 2, and 3 (positive digit range-4). The progression of the numeration system is base-2. The block diagram is for input words of up to three digits in word width, although the technique may be extended to any word widths. Positive redundant digit 2,4 coding is used to represent base-2 information in a redundantly encoded (range-4) representation so that ripple carries are never produced.

Addition is performed in three steps:
Step 1: $\overline{S}_i = 6-(X_i+Y_i)$
Step 2: $4D_{i+2}+2C_{i+1}+W_i = 6-\overline{S}_i$
Step 3: $\overline{R}_i = 3-(W_i+C_i+D_i)$ and the base-10 value of the result is given by $$\sum_{i=0}^{n-1} (3-\overline{R}_i)2^i$$

where n is the number of digits in the output word.

With reference to FIG. 10, Pairs of input digits $(X_i, Y_i)$ are first summed using terminal circuit 40 to produce inverted partial sums $\overline{S}_i = 6-(X_i+Y_i)$ as in Step 1, above (in positive digit multivalued number systems, the inverse of digit X is defined as M-X, where M is the maximum value a digit is allowed to have. In a positive digit range-7 representation, the inverse of digit X is 6-X. Each partial sum is then converted into an inverted 3-bit binary code using a range-7 multivalued-to-binary converter (R7MBC) 42. The R7MBC performs the function of Step 2, above. Finally, the binary outputs from the adjoining R7MBCs are shared and summed by terminal 44 to produce an inverted range-4 output result digits $\overline{R}_i$ (Step 3, above). The adder shown can be extended to compute the sum of two numbers of arbitrary word width. The speed of the circuit is independent of the number of input digits because only local intermediate results are shared within the circuit.

Figure 11:
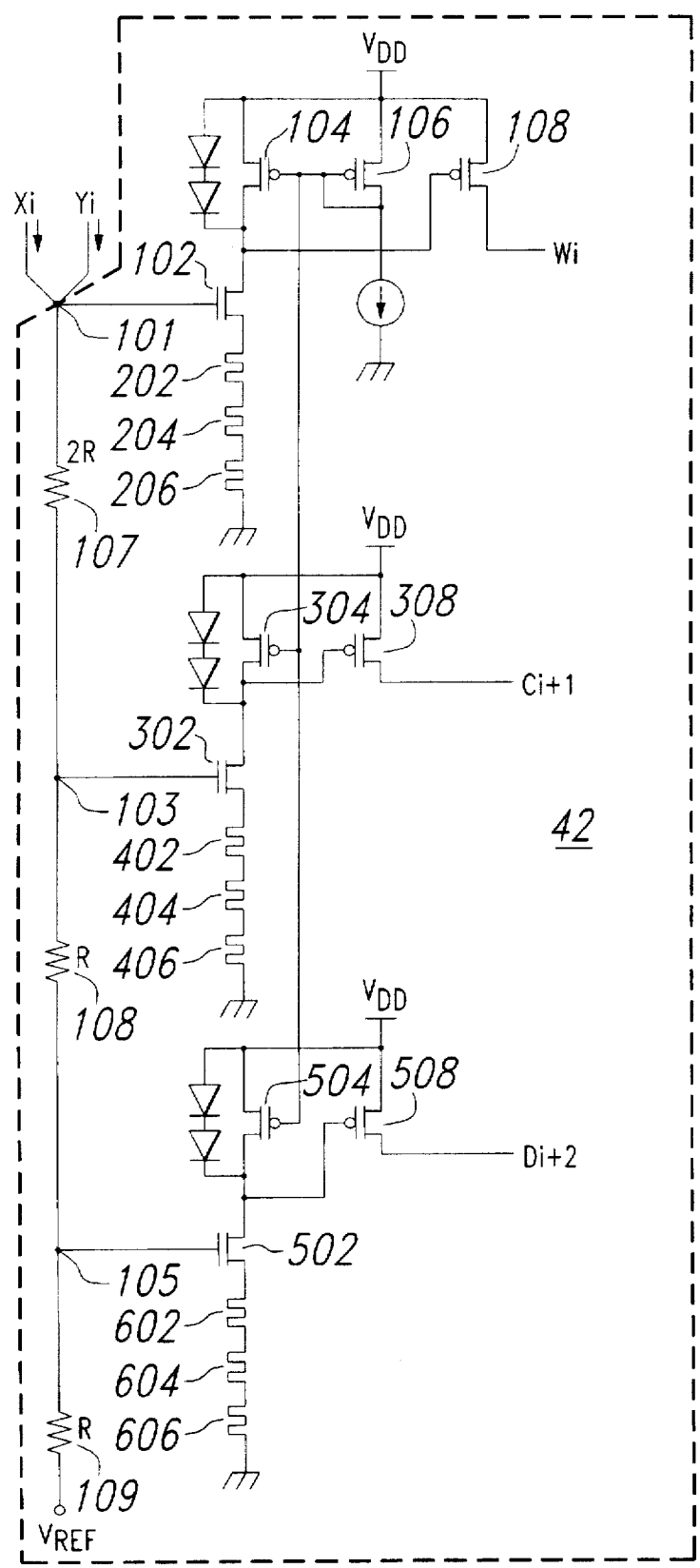
FIG. 11 is the schematic of another embodiment of a range-7 multivalued-to-binary converter circuit.
Figure 12:
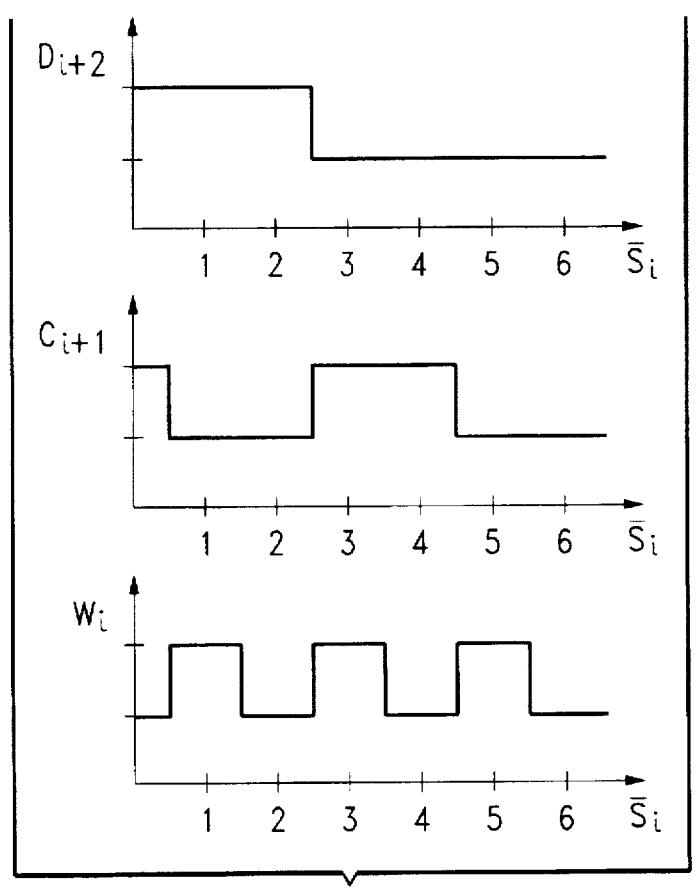
FIG. 12 is a graph of the transfer function of the other embodiment of the range-7 multivalued-to-binary converter circuit.

The circuit schematic of the second preferred embodiment of the R7MBC 42 is shown in FIG. 11. The corresponding transfer function shown in FIG. 12. This is essentially an inverted analog-to-digital conversion of the multivalued sum $\overline{S}_i$ and would require a considerable number of conventional transistors to implement. The R7MBC 42 quantizes the inputs 0 through 6 into an inverted binary output code. The function of the circuit is essentially the same as the first preferred embodiment of the R7MBC, except that a different reference voltage is generally required.

The preferred values of M-RTD parameters for the second embodiment are generally the same as those for the first preferred embodiment. The preferred values of FET parameters for the second preferred embodiment are generally the same as those for the first preferred embodiment.

A few preferred embodiments have been described in detail hereinabove. It is to be understood that the scope of the invention also comprehends embodiments different from those described, yet within the scope of the claims.

Internal and external connections can be ohmic, capacitive, direct or indirect, via intervening circuits or otherwise. Implementation is contemplated in discrete components or fully integrated circuits in silicon, gallium arsenide, or other electronic materials families. It should be understood that various embodiments of the invention can employ or be embodied in hardware, software or micro-coded firmware.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus for the conversion of a range-7 digit into a three digit binary word, said apparatus comprising:

three resonant tunneling multi-level folding circuits; and voltage divider circuitry coupled to said three resonant tunneling multi-level folding circuits.

2. The apparatus of claim 1, wherein said range-7 digit is only positive.

3. The apparatus of claim 1, wherein said resonant tunneling multi-level folding circuits comprise a resonant tunneling transistor.

4. The apparatus of claim 3, wherein said resonant tunneling transistor comprises a resonant tunneling diode.

* * * * *